United States Patent [19]

Haraguchi et al.

[11] Patent Number: 5,305,267
[45] Date of Patent: Apr. 19, 1994

[54] SEMICONDUCTOR MEMORY DEVICE ADAPTED FOR PREVENTING A TEST MODE OPERATION FROM UNDESIRABLY OCCURRING

[75] Inventors: Yoshiyuki Haraguchi; Yutaka Arita, both of Hyogo, Japan

[73] Assignee: Mitsubishi Denki Kabushiki Kaisha, Tokyo, Japan

[21] Appl. No.: 51,405

[22] Filed: Apr. 23, 1993

[30] Foreign Application Priority Data

Jun. 25, 1992 [JP] Japan ................... 4-166475

[51] Int. Cl.$^5$ ............................................ G11C 29/00
[52] U.S. Cl. ................... 365/201; 365/225.7; 365/233.5
[58] Field of Search .............. 365/201, 200, 96, 189.7, 365/191, 196, 225.7, 233.5

[56] References Cited

U.S. PATENT DOCUMENTS

| | | | |
|---|---|---|---|
| 4,956,816 | 9/1990 | Atsumi et al. | 365/201 |
| 5,023,840 | 6/1991 | Tobita | 365/201 |
| 5,132,937 | 7/1992 | Tuda et al. | 365/201 |
| 5,155,704 | 10/1992 | Walther et al. | 365/201 |
| 5,233,610 | 8/1993 | Nakayama et al. | 365/201 |

FOREIGN PATENT DOCUMENTS 0407173  1/1991  European Pat. Off. ............ 365/201

Primary Examiner—Eugene R. LaRoche
Assistant Examiner—Son Mai
Attorney, Agent, or Firm—Lowe, Price, LeBlanc & Becker

[57] ABSTRACT

When a pre-shipment test of a SRAM is requested, a pulse signal PL having a pulse width exceeding a predetermined time length is applied through a terminal 62. A pulse width detecting circuit 80 detects the pulse width of the applied pulse signal to provide a holding signal HD. A test mode signal holding circuit 90 holds an externally applied test mode request signal TM' in response to the holding signal HD. After the completion of the pre-shipment test, pulse width detecting circuit 80 is disabled by a fusion of a fuse 71. Fuse 71 is fused after the pre-shipment test is conducted, whereby the test mode operation is prevented from undesirably occurring.

10 Claims, 10 Drawing Sheets

SEMICONDUCTOR MEMORY DEVICE ADAPTED FOR PREVENTING A TEST MODE OPERATION FROM UNDESIRABLY OCCURRING

BACKGROUND OF THE INVENTION

Field of the Invention

The present invention generally relates to semiconductor memory devices and, more particularly, to a semiconductor memory device adapted for preventing a test mode operation from undesirably occurring. The present invention has particular applicability to static random access memories (SRAMs).

Description of the Background Art

Generally, a pre-shipment test insuring whether manufactured semiconductor integrated circuit devices can achieve desired functions or not is performed on semiconductor integrated circuit devices including a semiconductor memory or the like, before the shipment from the factory. In the pre-shipment test, a semiconductor memory, for example, is operated in an externally designated test mode. That is, some test mode signal is externally applied to the semiconductor memory, leading the semiconductor memory to carry out a test mode operation in response to the applied test mode signal.

In general, the pre-shipment test should be performed only in the manufacturing factories of semiconductor devices. For the user of the semiconductor device, it is not preferable for the shipped semiconductor device to be operated in the test mode for the pre-shipment test. However, depending on the case, the test mode operation may be caused unfavorably. In the following description, the explanation will first be made with a semiconductor memory on the reason for this unfavorable test mode operation being caused.

FIG. 6 is a block diagram of a static random access memory (hereinafter referred to as a "SRAM") showing a background of the present invention. Referring to FIG. 6, a SRAM 101 includes a plurality n of memory blocks BK1 to BKn and a block selector circuit 8 for selecting a memory block to be accessed. One of the memory blocks BK1 to BKn, for example, memory block BK1 includes a memory cell array 11 provided with memory cells arranged in rows and columns (not shown), a bit line loading circuit 171, a multiplexer 21 for selecting a bit line pair to be accessed, a write buffer 31 for data writing and a sense amplifier 41 for data reading. Similar circuit configurations are provided in other memory blocks BK2 to BKn.

The SRAM 101 further includes a row address buffer 51 receiving externally applied row address signals RA, a column address buffer 52 receiving externally applied column address signals CA, a block address buffer 53 receiving externally applied block address signals BA, a row decoder decoding row address signals RA, a column decoder 7 decoding column address signals CA, block selector 8 selecting a block to be accessed by decoding the block address signals BA, a data input buffer 55 receiving an input data signal DI, a data output buffer 56 providing an output data signal DO and a read/write control circuit 54 operating responsive to an externally applied chip selection signal /CS and a write enable signal /WE.

Next, a normal access operation will be described. When memory block BK1 is accessed, for example, the block address signal BA for designating memory block BK1 is applied to block selector circuit 8. Block selector circuit 8 decodes the applied block address signal BA to selectively activate only write buffer 31 and sense amplifier 41. In data reading, row decoder 6 activates one of word lines (not shown) in memory cell array 11 in response to the row address signal RA. Column decoder 7 selects one of the columns in memory cell array 11 in response to the column address signal CA. Therefore, a data signal stored in the memory cell designated by row decoder 6 and column decoder 7 is applied to sense amplifier 41 through multiplexer 21. The data signal amplified by sense amplifier 41 is provided as the output data DO through data output buffer 56.

In data writing, an input data DI is applied to write buffer 31 through input buffer 55. Column decoder 7 selects one of the columns in memory cell array 11 in response to the column address signals CA. Row decoder 6 activates one of the word lines in memory cell array 11 in response to the row address signal RA. Therefore, write buffer 31 writes a data signal in the memory cell designated by row decoder 6 and column decoder 7 through multiplexer 21.

FIG. 7 is a schematic diagram of a peripheral circuit of memory cell array 11 shown in FIG. 6. Referring to FIG. 7, for simplification of representation, only four memory cells 24a to 24d in memory cell array 11 are shown. Memory cells 24a and 24c are connected between bit lines 20a and 20b. Memory cells 24b and 24d are connected between bit lines 21a and 21b.

Bit line loading circuit 171 includes NMOS transistors 25a, 25b, 26a and 26b each connected between a power supply potential Vcc and the corresponding one of bit lines 20a, 20b, 21a and 21b, respectively. Multiplexer 21 includes NMOS transistors 27a and 27b connected between an I/O line pair 29a, 29b and bit lines 20a, 20b and also includes NMOS transistors 28a and 28b connected between an I/O line pair 29a, 29b and bit lines 21a, 21b, respectively. I/O line pair 29a and 29b are connected to the input of sense amplifier 41 and the output of write buffer 31, respectively.

Row decoder 6 selectively activates one of word lines WL0 and WL1 connected to the memory cell to be accessed. Memory cells 24a and 24b connected to word line WL0 constitute one memory cell row. When word line WL0 is activated, the memory cell row including memory cells 24a and 24b is accessed. Column decoder 7 activates one of column selection signals Y0 and Y1 for selecting a memory cell column to be accessed. When the column selection signal Y0 is activated, for example, transistors 27a and 27b are turned on, whereby the memory cell column including memory cells 24a and 24c is accessed.

FIG. 8 is a schematic diagram of a circuit showing one example of the memory cell of FIG. 7. Referring to FIG. 8, this memory cell MC1 (for example, 24a of FIG. 7) includes NMOS transistors 41a and 41b, resistances 43a and 43b as high resistance loads and NMOS transistors 42a and 42b as access gates.

FIG. 9 is a schematic diagram of a circuit showing another example of the memory cell of FIG. 7. Referring to FIG. 9, this memory cell MC2 includes NMOS transistors 41a and 41b, PMOS transistors 44a and 44b acting as loads and NMOS transistors 42a and 42 as access gates.

FIG. 10 is a timing chart showing a reading operation of memory cell 24a of FIG. 7. Referring to FIG. 10, an abscissa denotes the passage of time and an ordinate denotes a potential (volt). A line ADi shows a change in input signals of row address buffer 51 column address buffer 52. A line ADo shows a change in output signals of row and column address buffers 51 and 52. A line WL shows a change in word line WLO connected to memory cell 24a. A line I/O shows a change in the potential of I/O line pair 29a and 29b. A line SAo shows a change in the output voltage of sense amplifier 41. A line Do shows a change in the output voltage of data output buffer 56.

At time t0, the input address signal ADi is changed, whereby the output signal ADo of address buffers 51 and 52 is changed in at time t1. At time t2, a potential of word line WLO changes, whereby a data signal stored in memory cell 24a is transmitted to bit line pair 20a and 20b. In addition, the column selection signal YO provided from the column decoder 7 attains a high level, whereby transistors 27a and 27b are turned on. Consequently, at time t3, potentials of I/O line pair 29a and 29b are changed.

At time t4, sense amplifier 41 is activated responsive to a control signal supplied by read/write control circuit 54, whereby the data signal is amplified by sense amplifier 41. Therefore, at time t5, the output signal Do of data output buffer 56 is changed according to the data read out from memory cell 24a.

In the foregoing pre-shipment test, an accelerated test of a semiconductor device is generally performed. The accelerated test is also performed on the SRAM by applying an environmental stress (temperature, humidity, vibration or the like) and an electric stress (voltage, current or the like) to the SRAM. That is, after the above-described stress is applied to the SRAM, data writing and data reading are performed on that SRAM. Data writing and data reading are repeatedly performed on all of the memory cells in the memory cell array, whereby a match of written data and read data is ensured. When a match of a written data and a read data is not detected, the SRAM is scrapped as defective.

In recent years, the following improvement is effected to shorten the test hour, since it takes very long time to perform the above-described data writing and data reading on each of the memory cells, and to read out a match, respectively.

Referring again to FIG. 6, the SRAM 101 further includes a match detecting circuit 5 connected to receive data signals provided from sense amplifiers 4l to 4n. When a test mode signal TM is externally applied through a spare terminal 57, match detecting circuit 5, write buffers 3l to 3n and sense amplifiers 4l to 4n are enabled. As a result, a common input signal DI can be written in the memory cells of the corresponding address in memory cell arrays 1l to 1n. In addition, data signals read out from the memory cell of the corresponding address in each of memory cell arrays 11 to n can be simultaneously applied to match detecting circuit 5 through sense amplifiers 4l to 4n. A signal showing a match detection result is provided through data output buffer 56 in the test mode.

During the period of the application of the test mode signal TM, the row address signals RA and the column address signals CA are repeatedly applied, the data signal is written in the memory cell of the corresponding address in each of memory cell arrays 11 to 1n, and the stored data signals are read out. In match detecting circuit 5, when a match between the written data and the read data is detected in every address, the SRAM of which is determined as "effective". Thus, since repetition of the data writing and the data reading can be performed in parallel on all of the memory cell arrays 11 to 1n by using match detecting circuit 5, time required for the test is reduced.

In SRAM 101 shown in FIG. 6, spare terminal 57 is employed to designate the test mode. When the SRAM does not have a spare terminal, a high voltage detecting circuit 59 shown in FIG. 11 is provided.

FIG. 11 is a block diagram of an another example of the SRAM showing the background of the present invention. Referring to FIG. 11, this SRAM 102 includes high voltage detecting circuit 59 connected to the most significant terminal 58 of external terminals receiving the block address signals BA. When a test mode is externally designated, a high voltage signal HV over a power supply potential Vcc is applied through terminal 58. High voltage detecting circuit 59 provides a test mode signal TM in response to the application of the high voltage signal HV. The test mode signal TM is applied to match detecting circuit 5, write buffers 3l to 3n and sense amplifiers 4l to 4n.

Terminal 58 for receiving the most significant bit of the block address signals BA is used to designate a memory block in normal operation. In the test mode, all of the memory blocks are accessed as described above. Therefore, since the designation of the memory block is not required, terminal 58 can be used to externally designate the test mode in the test mode. That is, no problem is caused in the test mode by the application of the high voltage signal HV through terminal 58.

A similar test operation to that of the SRAM 101 shown in FIG. 6, that is a match detecting operation by the match detecting circuit 5 is repeated after the provision of the test mode signal TM from high voltage detecting circuit 59.

FIG. 12 is a block diagram showing yet another example of the SRAM showing the background of the present invention. Referring to FIG. 12, a SRAM 103 includes a high voltage detecting circuit 60 connected to a terminal 62 for receiving a write enable signal /WE, and a test mode signal holding circuit 61 connected to terminal 58 for receiving the most significant bit of the block address signals BA. When the test mode is externally designated, the high voltage signal HV is applied through terminal 62. High voltage detecting circuit 60 provides a holding signal HD in response to the high voltage signal HV. Test mode signal holding circuit 61 holds a test mode signal TM' applied through terminal 58 in response to the application of the holding signal HD. The held signal is provided from test mode signal holding circuit 61 as the test mode signal TM.

In the SRAM 103 of FIG. 12, high voltage detecting circuit 60 and test mode signal holding circuit 61 are employed to externally designate the test mode. After the test mode signal TM' is once held in test mode signal holding circuit 61, the test mode signal TM is continuously applied to match detecting circuit 5, write buffers 3l to 3n and sense amplifiers 4l to 4n. Therefore, a successive application of the high voltage signal HV to terminal 62 is not necessary after the completion of the designation of the test mode. A match detecting operation by match detecting circuit 5 is performed in the same manner as the SRAM 101 of FIG. 6.

FIG. 13 is a schematic diagram of high voltage detecting circuit 60 shown in FIG. 12. Referring to FIG. 13, high voltage detecting circuit 60 includes an inverter 78 for a level determination and NMOS transistors 86, 87 and 88 connected in series between terminal 62 and the input node of inverter 78. Each of transistors 86, 87 and 88 has the corresponding gate connected to the corresponding drain to constitute a diode.

In operation, when a signal not more than the power supply potential Vcc is applied through terminal 62, inverter 78 provides the holding signal HD of a high level. Therefore, test mode signal holding circuit 61, in this case, does not hold the signal TM' applied through terminal 58. When the high voltage signal HV over the power supply potential Vcc is applied through terminal 62, inverter 78 provides the holding signal HD of a low level. Test mode signal holding circuit 61 holds the test mode signal TM' applied through terminal 58 in response to the signal HD, whereby the held signal is provided as the test mode signal TM. It should be noted that high voltage detecting circuit 60 shown in FIG. 13 can also be employed as high voltage detecting circuit 59 shown in FIG. 11.

As can be seen from the foregoing description, in SRAM's 102 and 103 shown in FIGS. 11 and 12, terminals 58 and 62 having other purposes are used together to externally designate the test mode. The share of terminals 58 and 62 contributes to the prevention of the increase in the external terminal, however, it may cause the problems set forth as in the following.

Since high voltage detecting circuits 59 and 60 have a circuit configuration shown in FIG. 13, a threshold value for determining the high voltage signal HV can be frequently changed by some reasons caused in the manufacturing of the SRAMs. The potential of the high voltage signal HV should be selected higher for performing the designation of the test mode correctly, however, the supply of such high voltage easily destroys a MOS transistor. Therefore, it is necessary to select the potential of the high voltage signal HV within the range which exceeds the power supply potential Vcc but is not so high. As a result, when a threshold value for determining the high voltage is lowered by some reason caused in the manufacturing process, the designation of the test mode may be recognized despite of being not required by the user. Consequently, the test mode operation in the SRAM is started in such a case, thereby being recognized as a malfunction by the user of the SRAM.

SUMMARY OF THE INVENTION

One object of the present invention is to prevent a test mode operation from undesirably occurring in a semiconductor memory device.

Another object of the present invention is to prevent a test mode operation from undesirably occurring in a static random access memory (SRAM).

Briefly, a semiconductor memory device according to the present invention includes a first terminal for receiving an externally applied pulse signal, a second terminal for receiving an externally applied test mode signal, a pulse width detecting circuit for detecting that the pulse signal supplied through the first terminal has a pulse width exceeding a predetermined time length, a test mode signal holding circuit for holding a test mode signal supplied through the second terminal in response to the pulse width detecting circuit, a test circuit for performing a test in the semiconductor memory device in response to the test mode signal held in the test mode signal holding circuit and a disabling circuit for disabling a detecting operation by the pulse width detecting circuit in case that the test should not be carried out by the test circuit.

In operation, the test mode signal holding circuit holds the test mode signal supplied through the second terminal only when the pulse width detecting circuit detects that the pulse signal having a pulse width exceeding a predetermined time length has been applied. The test circuit carries out a test in the semiconductor memory device in response to the held test mode signal. In addition, when the test should not be carried out by the test circuit, the disabling circuit disables the detecting operation by the pulse width detecting circuit. Therefore, the test mode signal holding circuit does not hold the test mode signal when the test should not be carried out by the test circuit, whereby the test circuit is prevented from undesirably operating.

According to another aspect of the present invention, the semiconductor memory device includes a first terminal for receiving a high voltage signal which is externally applied and exceeds a power supply potential, a second terminal for receiving an externally applied test mode signal, a high voltage detecting circuit for detecting the application of the high voltage signal through the first terminal, a test mode signal holding circuit for holding a test mode signal supplied through the second terminal responsive to the high voltage detecting circuit, a test circuit for carrying out a test in the semiconductor memory device in response to the test mode signal held in the test mode signal holding circuit and a disabling circuit for disabling a detecting operation by the high voltage detecting circuit when the test should not be carried out by the test circuit.

In operation, the disabling circuit disables the detecting operation by the high voltage detecting circuit when the test should not be carried out by the test circuit. As a result, the test mode signal holding circuit does not hold the test mode signal in such a case, whereby the test circuit is prevented from undesirably operating.

According to yet another aspect of the present invention, the semiconductor memory device includes a predetermined terminal for receiving a high voltage signal which is externally applied and exceeds the power supply potential, a high voltage detecting circuit for detecting that the high voltage signal has been supplied through the predetermined terminal, a test circuit for carrying out a test in the semiconductor memory device in response to the high voltage detecting circuit and a disconnecting circuit for disconnecting the high voltage detecting circuit from the predetermined terminal when the test should not be carried out by the test circuit.

In operation, the disconnecting circuit disconnects the high voltage detecting circuit from the predetermined terminal when the test should not be carried out by the test circuit. As a result, the high voltage detecting circuit does not operate, whereby the test circuit is prevented from undesirably operating.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
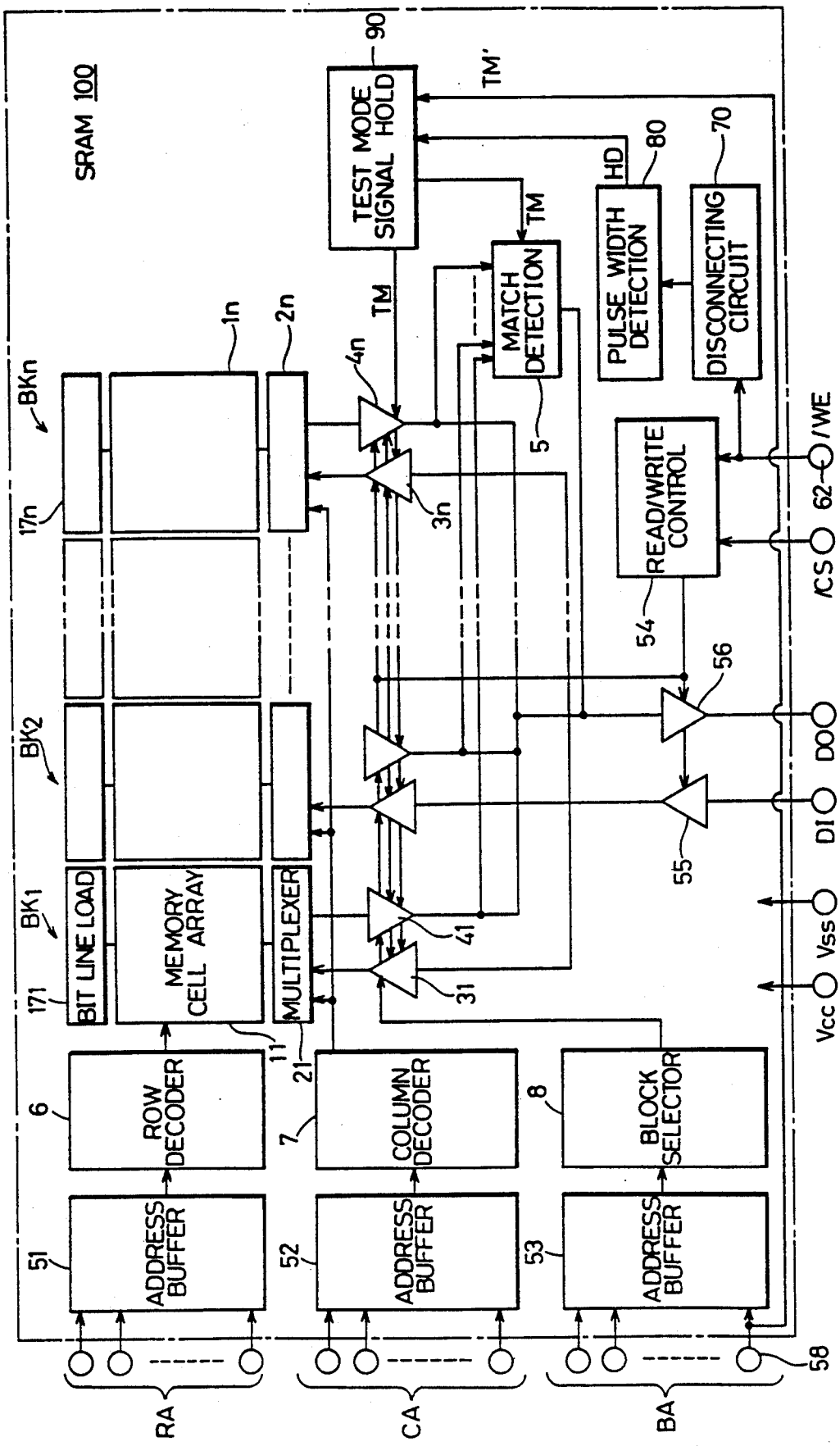
FIG. 1 is a block diagram of a SRAM showing one embodiment of the present invention.
Figure 6:
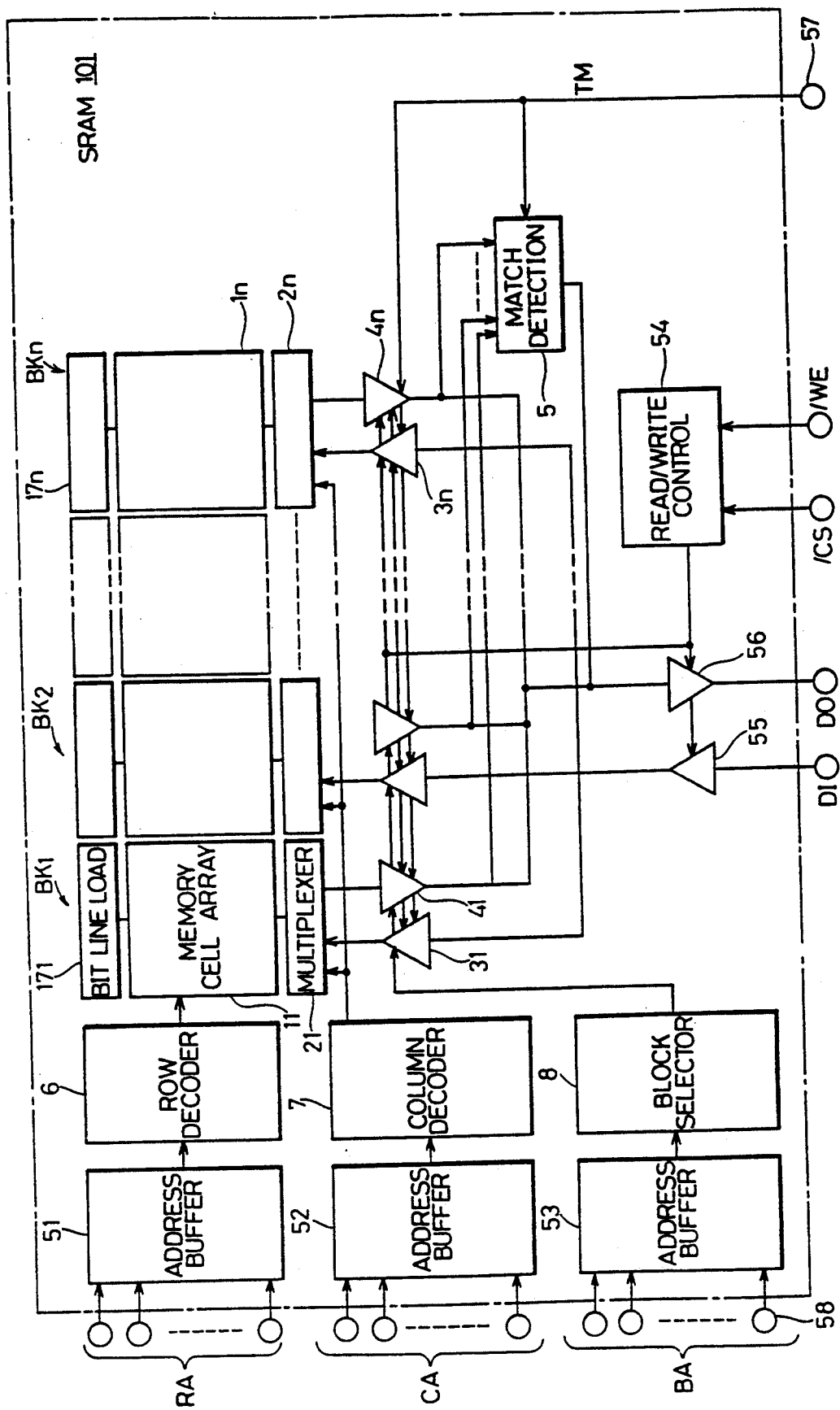
FIG. 6 is a block diagram of one example of the SRAM showing the background of the present invention.
Figure 7:
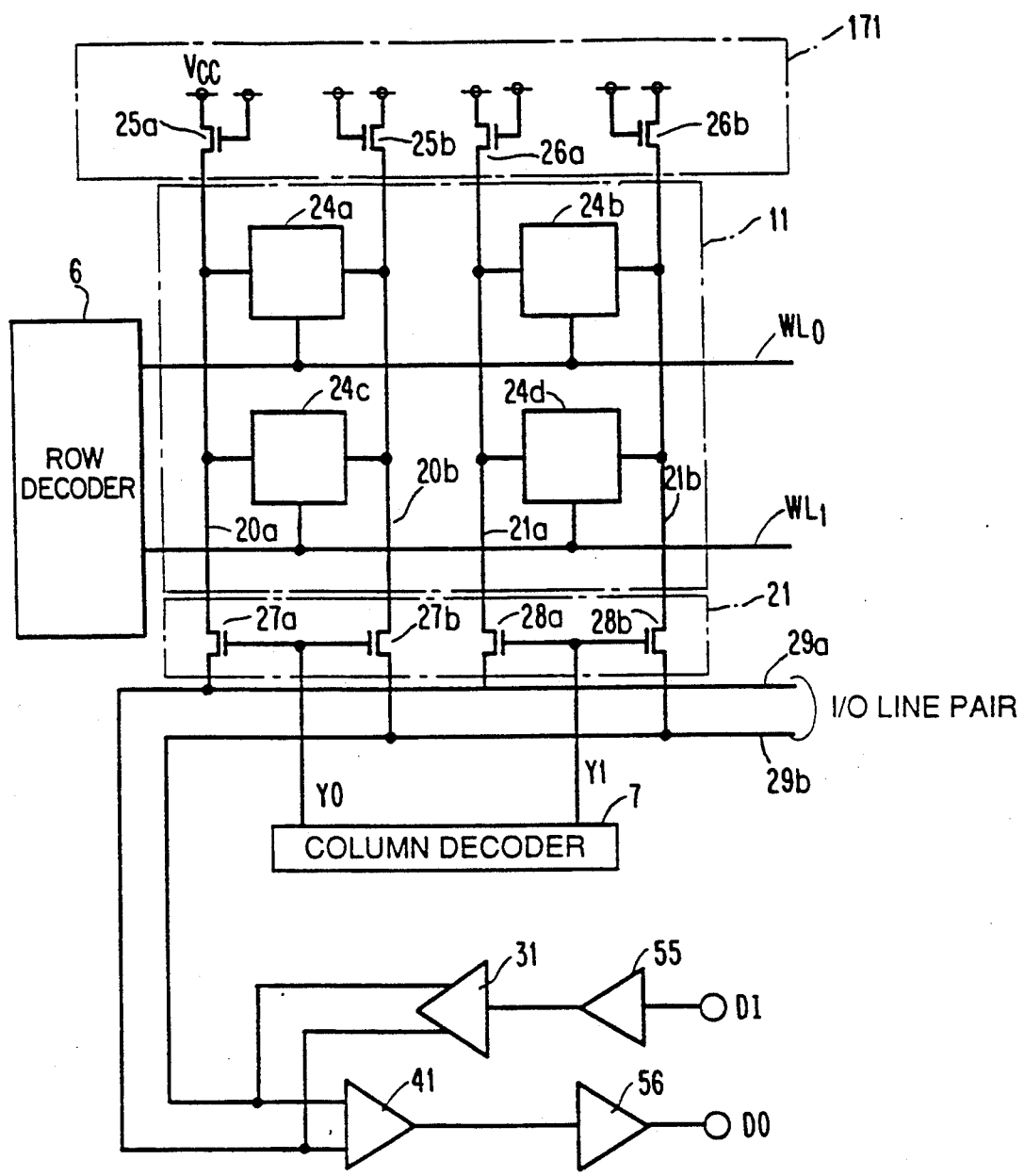
FIG. 7 is a schematic diagram of a peripheral circuit of a memory cell array shown in FIG. 6.
Figure 8:
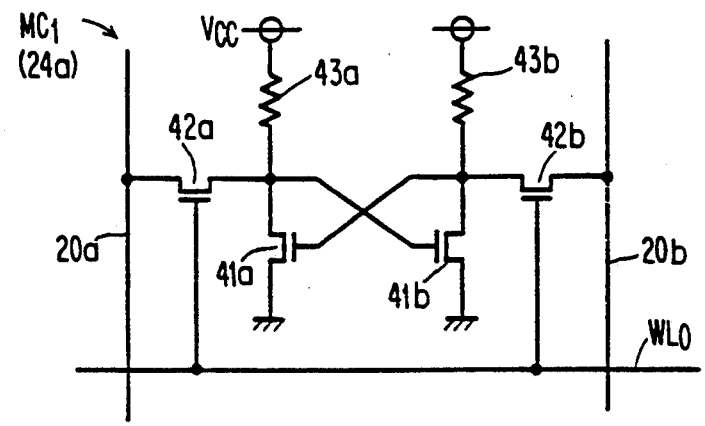
FIG. 8 is a schematic diagram of a circuit showing one example of the memory cell of FIG. 7.
Figure 9:
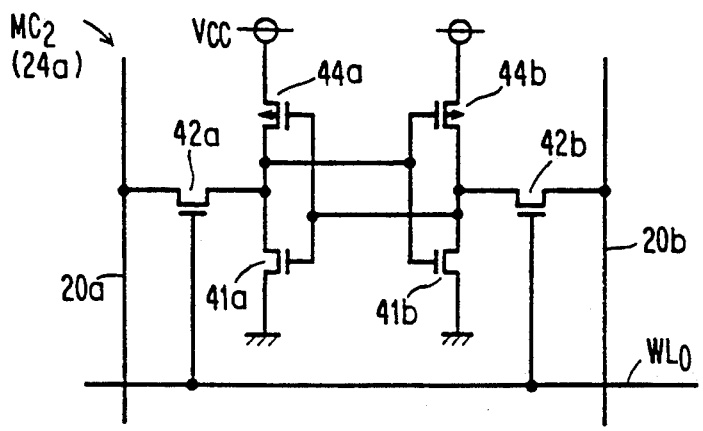
FIG. 9 is a schematic diagram of a circuit showing an another example of the memory cell of FIG. 7.
Figure 10:
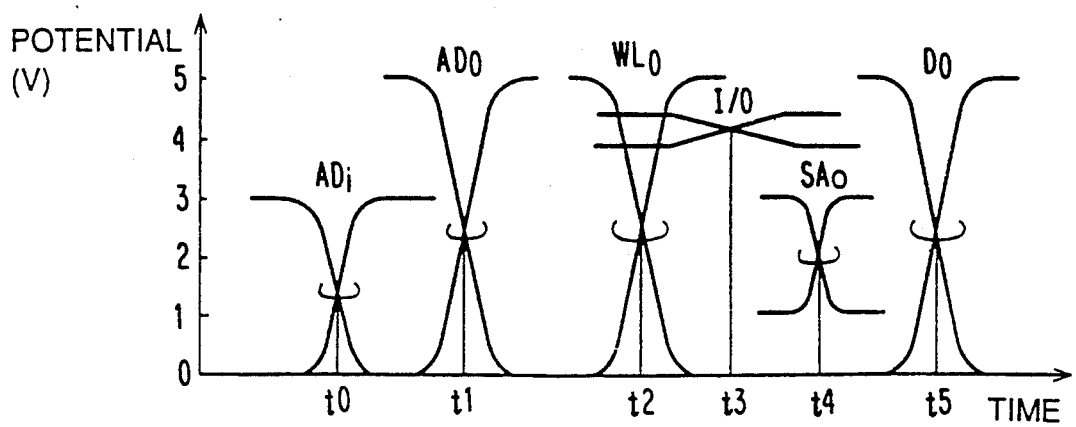
FIG. 10 is a timing chart showing a reading operation of the memory cell of FIG. 7.

Referring to FIG. 1, a SRAM 100 includes a disconnecting circuit 70 connected to a terminal 62 for receiving a write enable signal /WE, a pulse width detecting circuit 80 for detecting a pulse width of a pulse signal supplied through disconnecting circuit 70 and a test mode signal holding circuit 90 connected to a terminal 58 for receiving the most significant bit of block address signals BA. Since other circuit configurations of SRAM 100 are similar to those of a SRAM 101 shown in FIG. 6, an explanation will not be given.

Figure 2:
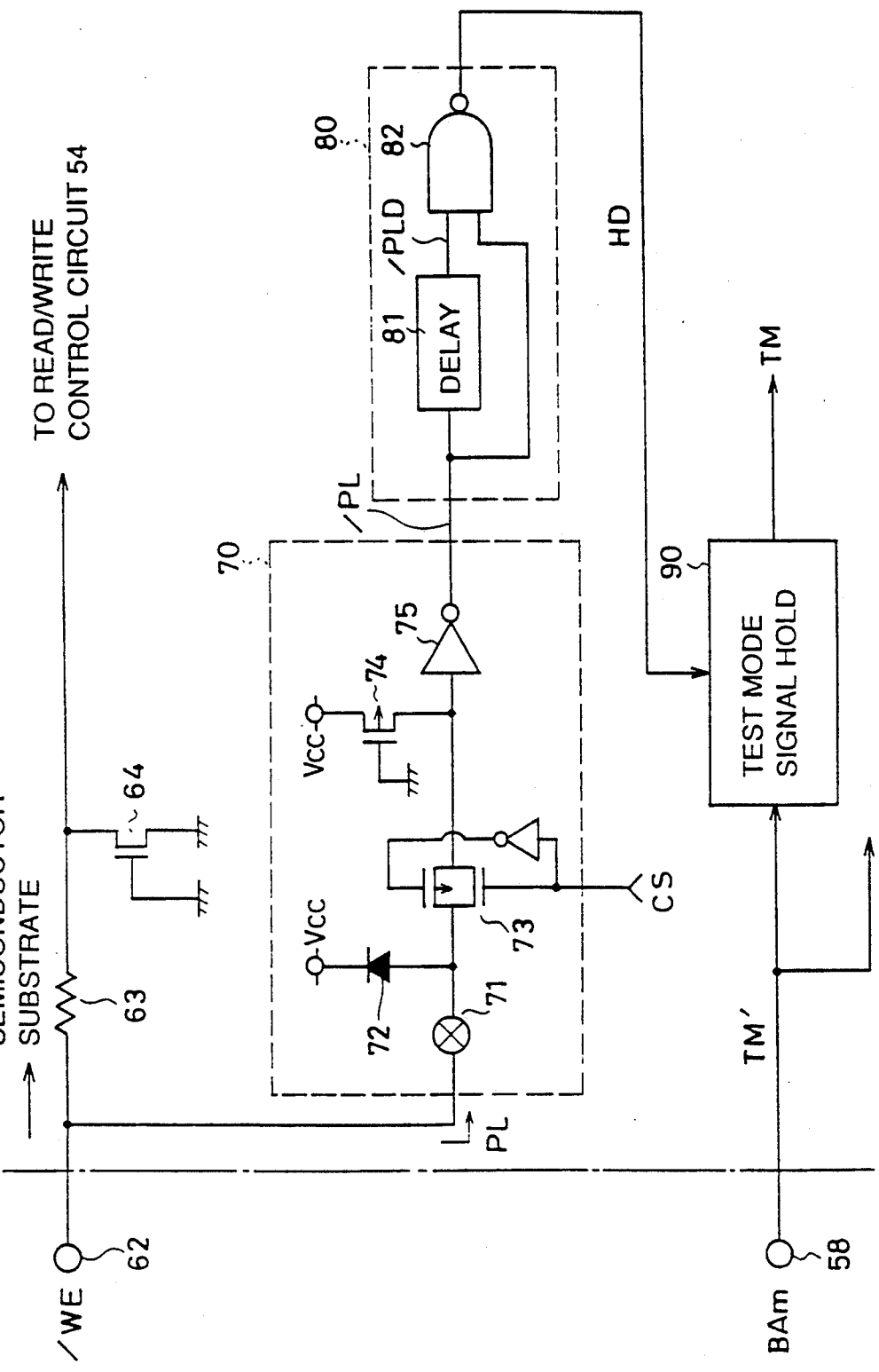
FIG. 2 is a schematic diagram showing a disconnecting circuit and a pulse width detecting circuit of FIG. 1.

FIG. 2 is a schematic diagram of disconnecting circuit 70 and pulse width detecting circuit 80 shown in FIG. 1. Referring to FIG. 2, disconnecting circuit 70 includes a fuse 71 connected to terminal 62, a transmission gate 73 through which a pulse signal PL passes responsive to a chip selection signal CS, an inverter 75 connected to receive the pulse signal PL, a PMOS transistor 74 for pulling up an input node of inverter 75 and a diode 72 connected between fuse 71 and a power supply potential Vcc. The gate of transistor 74 is grounded.

Pulse width detecting circuit 80 includes a delay element 81 receiving an inverted pulse signal /PL provided from disconnecting circuit 70 and a NAND gate 82 receiving the signal /PL and a delayed signal /PLD. An output signal of NAND gate 82 is applied to a test mode signal holding circuit 90 as a holding signal HD.

A resistance 63 and a NMOS transistor 64 shown in FIG. 2 are provided as an input protecting circuit for a read/write control circuit 54.

Figure 3:
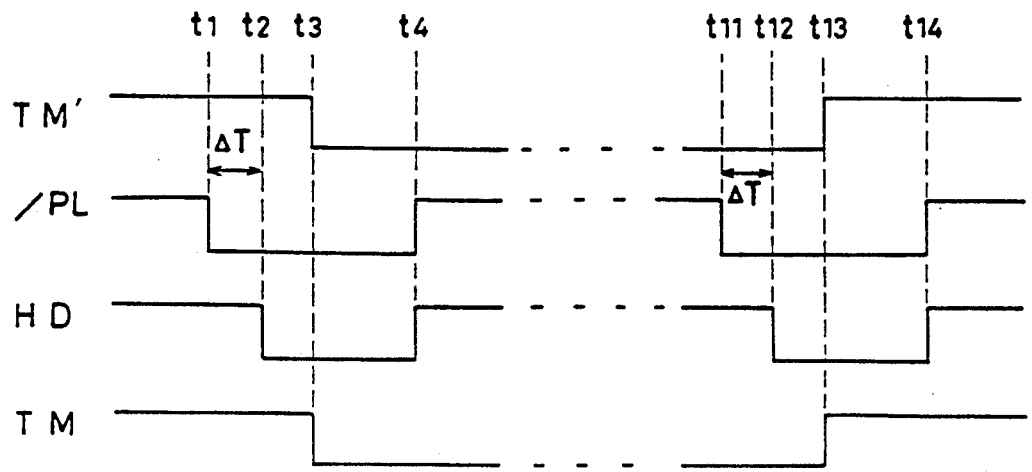
FIG. 3 is a timing chart showing an operation of the pulse width detecting circuit of FIG. 2.

FIG. 3 is a timing chart showing an operation of pulse width detecting circuit 80 of FIG. 2. Referring to FIGS. 2 and 3, a test mode designating operation will be described hereinafter.

The pulse signal PL for requesting the test mode signal to be held is applied to disconnecting circuit 70 through terminal 62. The pulse signal PL is applied to inverter 75 through fuse 71 and transmission gate 73. The externally applied pulse signal PL can transmit the pulse without being affected by PMOS transistor 74 for pull-up. In other words, transistor 74 does not have a mutual conductance strong enough to pull up the input node of inverter 75 against the pulse signal PL. Therefore, the inverted pulse signal /PL is provided through inverter 75.

The pulse signal /PL is delayed by delay element 81, and the delay pulse signal /PLD is applied to NAND gate 82. NAND gate 82 also receives the pulse signal /PL. A delay time ΔT at delay element 81 is, for example, set to 100 ms. Therefore, NAND gate 82 provides an output signal HD of low level when the pulse signal /PL is at a low level over the time length ΔT, that is, the pulse signal /PL has a pulse width exceeding ΔT. Referring to FIG. 3, after the fall of the pulse signal /PL at time t1, NAND gate 82 provides a low level signal HD at time t2 after the lapse of the time length ΔT.

Test mode signal holding circuit 90 is rendered to be in the holding state for a test mode signal TM' in response to the low level holding signal HD. At time t3, the test mode signal TM' requesting the test mode through terminal 58 falls. Therefore, test mode signal holding circuit 90 holds the test mode request signal TM' of low level responsive to the low level holding signal HD. The held signal is provided from the test mode signal holding circuit 90 as the low level test mode signal TM. When the low level test mode signal is provided, the test mode operation is carried out in SRAM 100.

After the test mode signal TM is once held in test mode signal holding circuit 90, it is not necessary to keep on applying some special signals to terminals 62 and 58. Therefore, these terminals 62 and 58 can be used according to the necessity in the test mode operation. A cancellation of the test mode is performed set forth as in the following.

At time t11, the low level pulse signal /PL is applied to pulse width detecting circuit 80. At time t12 after the lapse of the time length ΔT after the time t11, pulse width detecting circuit 80 provides the low level signal HD. Therefore, test mode signal holding circuit 90 is brought to be a state in which the test mode canceling signal ' TM, can be held responsive to the low level holding signal HD.

At time t13, the high level test mode canceling signal TM' is applied to test mode signal holding circuit 90. Therefore, test mode signal holding circuit 90 holds the high level signal TM', and provides the held signal as the test mode signal TM. That is, the high level test signal TM is applied to a match detecting circuit 5, write buffers 3*l* to 3*n* and sense amplifiers 4*l* to 4*n*. When the high level test mode signal TM is provided, the test mode operation in SRAM 100 is completed, whereby the SRAM 100 is rendered to be in the state for a normal operation.

Figure 4:
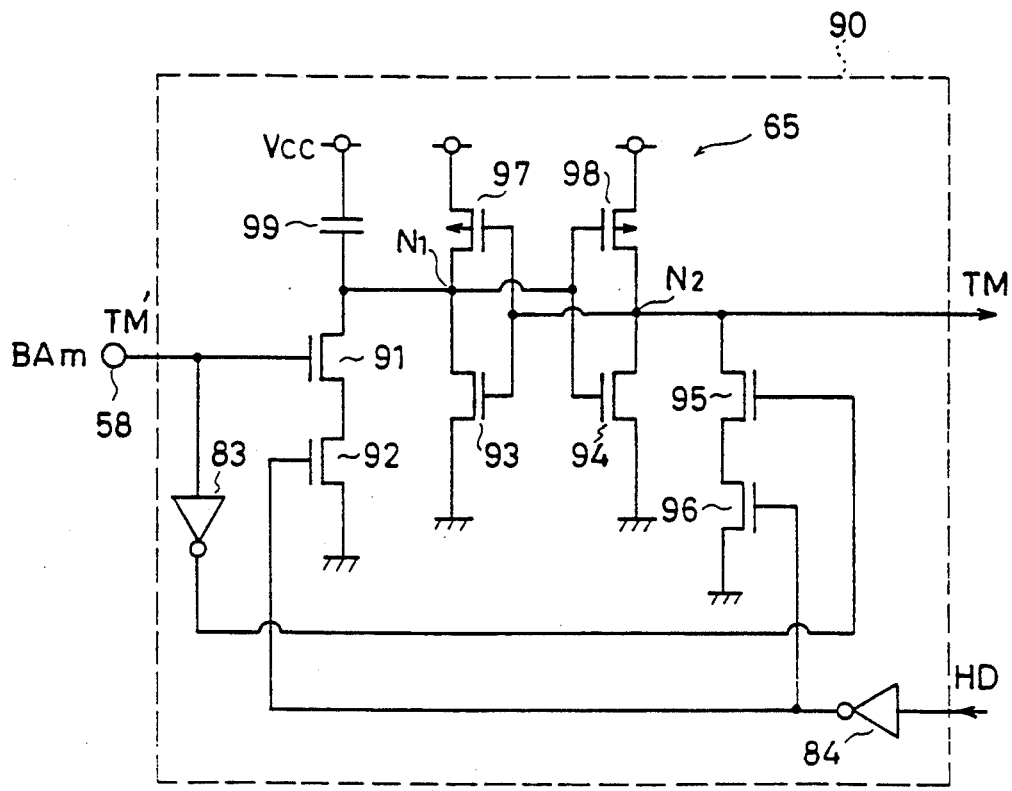
FIG. 4 is a schematic diagram of a test mode signal holding circuit shown in FIG. 1.

FIG. 4 is a schematic diagram of test mode signal holding circuit 90 shown in FIG. 1. Referring to FIG. 4, test mode signal holding circuit 90 includes inverters 83, 84 and 85, and NMOS transistors 91 to 96, PMOS transistors 97 and 98, and a capacitor 99.

In operation, when the low level holding signal HD is applied, inverter 84 applies a high level signal to the gates of transistors 92 and 96, leading them to be turned on. In addition, when the low level test mode request signal TM' is applied through terminal 58, inverter 83 applies a high level signal to the gate of transistor 95. Consequently, an output node N2 of a latch circuit 65 constituted by transistors 93, 94, 97 and 98 are force to be pulled down. Thus, transistors 97 and 94 are turned on, whereby the low level test mode signal TM is provided from latch circuit 65 through node N2.

Transistor 91 is turned on and transistor 95 is turned off, when the high level test mode canceling signal TM' is applied in the period during which the low level holding signal HD is applied. Thus, a node N1 of latch circuit 65 is forced to be pulled down by transistors 91 and 92, whereby transistors 98 and 93 are turned on. As a result, the high level test mode signal TM is provided through node N2.

When the high level holding signal HD is applied, transistors 92 and 96 are turned off. Thus, the holding state of the test mode signal in latch circuit 65 is maintained, whereby the level of the test mode signal TM provided from test mode signal holding circuit 90 is retained.

In the period when test mode signal holding circuit 90 shown in FIG. 4 provides the low level test mode signal TM, the test mode operation using match detecting circuit 5, write buffers 3l to 3n and sense amplifiers 4l to 4n is performed. On the other hand, when the high level test mode signal TM is provided, match detecting circuit 5 is disabled, whereby a normal access operation of write buffers 3l to 3n and sense amplifiers 4l to 4n is performed.

When the test mode operation should not be performed, test mode signal holding circuit 90 is required to constantly provide the high level test mode signal TM. Therefore, a supply of the power supply voltage Vcc is started, a threshold voltage of each of transistors 91 to 93 is designed to be lowered than that of each of transistors 94 to 96, respectively, so that test mode signal holding circuit 90 automatically provides the high level test mode signal TM. Therefore, test mode signal holding circuit 90 can constantly provide the high level test mode signal TM after the supply of the power supply voltage Vcc even without the holding signal HD. Consequently, SRAM 100 is always brought to the state for a normal operation mode after the supply of the power supply voltage Vcc.

Referring again to FIG. 2, fuse 71 in disconnecting circuit 70 is disconnected after the completion of the pre-shipment test. That is, the detecting operation of pulse width detecting circuit 80 is disabled by the disconnection of fuse 71, since the test mode operation should not be carried out after the shipment of SRAM 100. The disconnection of fuse 71 will be performed set forth as in the following.

The power supply voltage terminal Vcc shown in FIG. 1 is grounded, in addition, a high level voltage is applied through terminal 62. Thus, a current flows from terminal 62 to the grounded power supply terminal Vcc through fuse 71 and diode 72, whereby fuse 71 is fused. The input node of inverter 75 is physically disconnected from terminal 62 by the fusion of fuse 71.

When a normal power supply voltage Vcc is applied to SRAM 100, the input node of inverter 75 is always pulled up by transistor 74. Thus, inverter 75 provides the signal /PL fixed to be at a low level. As a result, the pulse width detecting circuit is disabled, whereby the high level holding signal HD is provided. Test mode signal holding circuit 90 does not hold any of the signals applied to terminal 58, since it is provided with the high level holding signal HD. Thus, the test mode operation is prevented from undesirably occurring.

Figure 5:
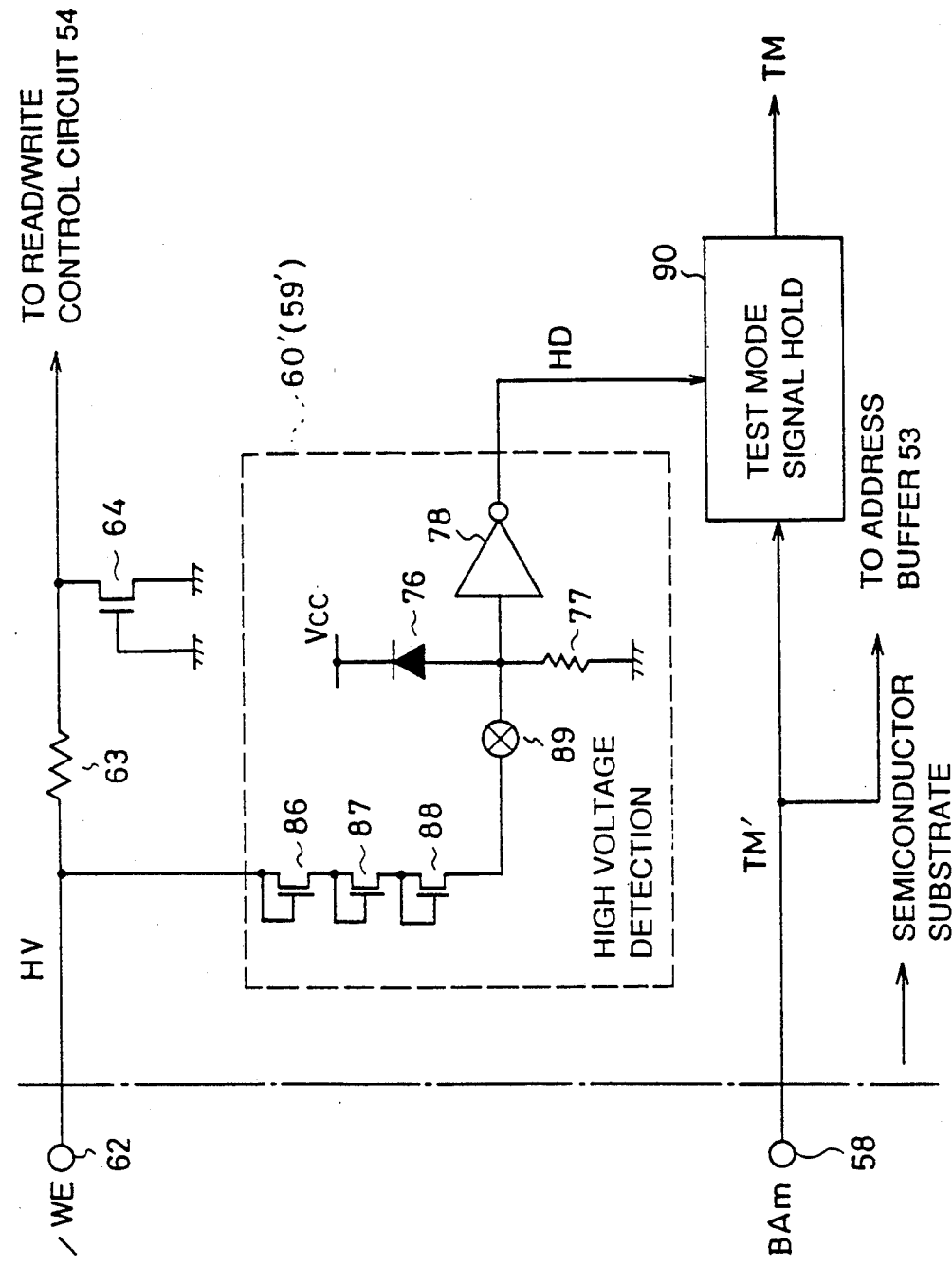
FIG. 5 is a schematic diagram of a high voltage detecting circuit applicable to the SRAM in another embodiment of the present invention.
Figure 13:
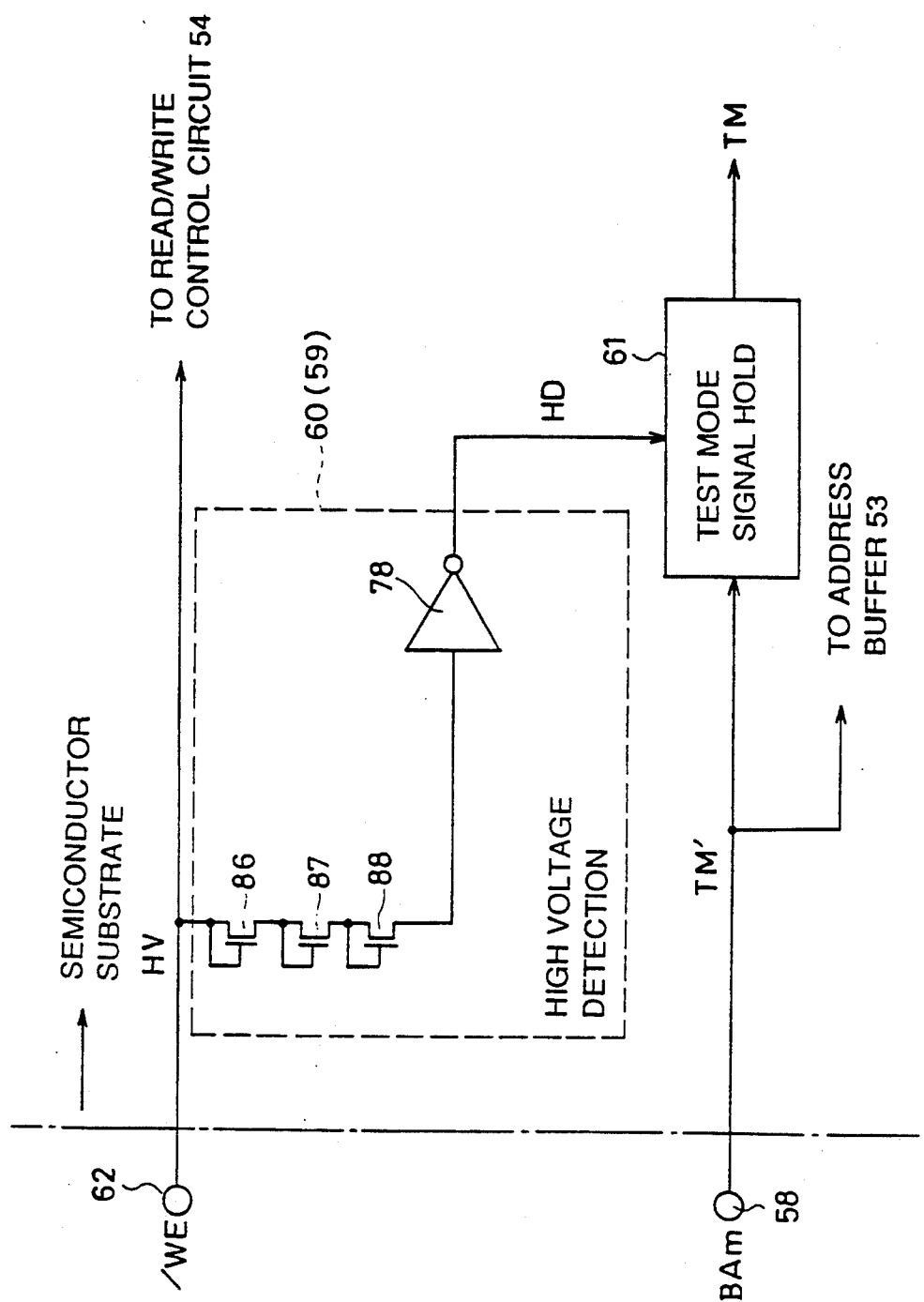
FIG. 13 is a schematic diagram of the high voltage detecting circuit shown in FIG. 12.

FIG. 5 is a schematic diagram of a high voltage detecting circuit applicable to the SRAM in another embodiment of the present invention. Referring to FIG. 5, an improved high voltage detecting circuit 60', in comparison with the circuit 60 shown in FIG. 13, further includes a fuse 89, a diode 76 and a resistance 77. Fuse 89 is connected between a serial connection of transistors 86 to 88 and the input node of the inverter 78. Diode 76 is connected between the power supply voltage terminal Vcc and the input node of an inverter 78. Resistance 77 is connected between the input node of inverter 78 and the ground potential.

High voltage detecting circuit 60' shown in FIG. 5 may alternatively be employed in place of high voltage detecting circuits 59 and 60 in the SRAM's 102 and 103.

When the high voltage signal HV exceeding the power supply potential Vcc is applied through terminal 62, inverter 78 provides the low level holding signal HD. Test mode signal holding circuit 90 holds the test mode request signal or the test mode canceling signal TM' in response to the low level signal HD. The held signal is provided from test mode signal holding circuit 90 as the test mode signal TM.

After the completion of the pre-shipment test, fuse 89 is fused. The fusion of fuse 89 is performed in the same manner as that of fuse 71 shown in FIG. 2. That is, a high level voltage is applied through terminal 62 after the power supply voltage terminal Vcc is grounded. Therefore, since a current flows towards the grounded power supply voltage terminal Vcc through transistors 86 to 88, fuse 89 and diode 76, fuse 89 is fused. In other words, the input node of inverter 78 is physically disconnected from terminal 62 by the fusion of fuse 89.

The input node of inverter 78 is rendered to be at a low level by the function of resistance 77 after the power supply voltage Vcc is applied to the SRAM. Test mode signal holding circuit 90 does not hold the signal TM', since inverter 78 provides the high level holding signal HD. Therefore, test mode signal holding circuit 90 does not provide the low level test mode signal TM, whereby the test mode operation is prevented from undesirably occurring.

Figure 11:
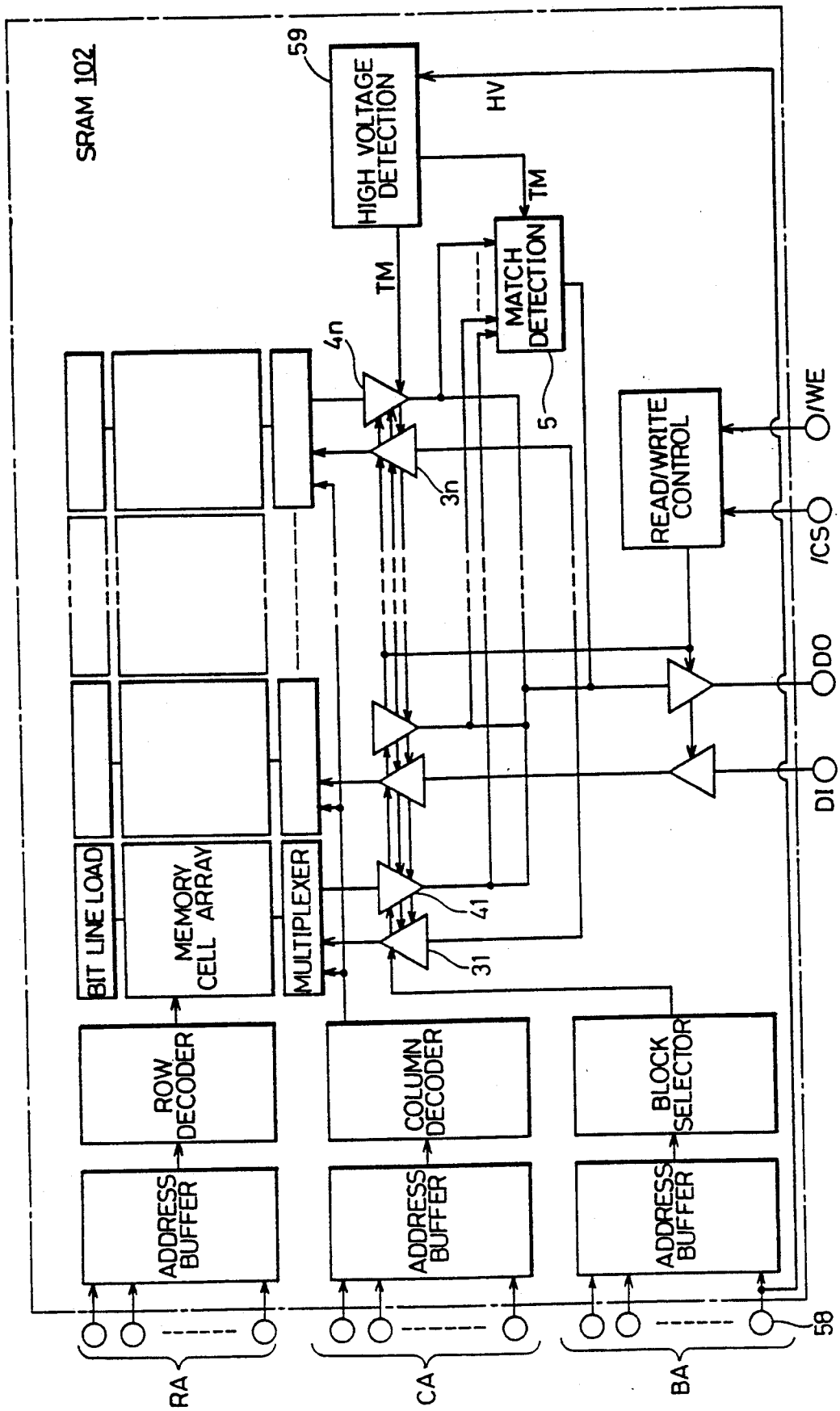
FIG. 11 is a block diagram showing another example of the SRAM showing the background of the present invention.

It should be noted that high voltage detecting circuit 60' shown in FIG. 5 may be applied in place of high voltage detecting circuit 59 in SRAM 102 of FIG. 11. In the embodiment of such SRAM, the test mode signal TM is directly provided from inverter 78. After the completion of the pre-shipment test, fuse 89 is fused, whereby the high level test mode signal TM is constantly provided. Thus, the test mode operation is prevented from undesirably occurring.

As described above, SRAM 100 shown in FIG. 1 includes disconnecting circuit 70 and pulse width detecting circuit 80 shown in FIG. 2. Pulse width detecting circuit 80 provides the low level holding signal HD responsive only to the application of the pulse signal PL having the pulse width exceeding the predetermined time length ΔT. Therefore, test mode signal holding circuit 90 holds the signal TM' only when the specified pulse signal PL is applied, which prevents the erroneous provision of the test mode signal TM from test mode signal holding circuit 90. In addition, after the completion of the pre-shipment test, fuse 71 is fused, whereby pulse width detecting circuit 80 is disabled. Therefore, test mode signal holding circuit 90 does not hold the applied signal TM', whereby the test mode operation is not carried out.

Figure 12:
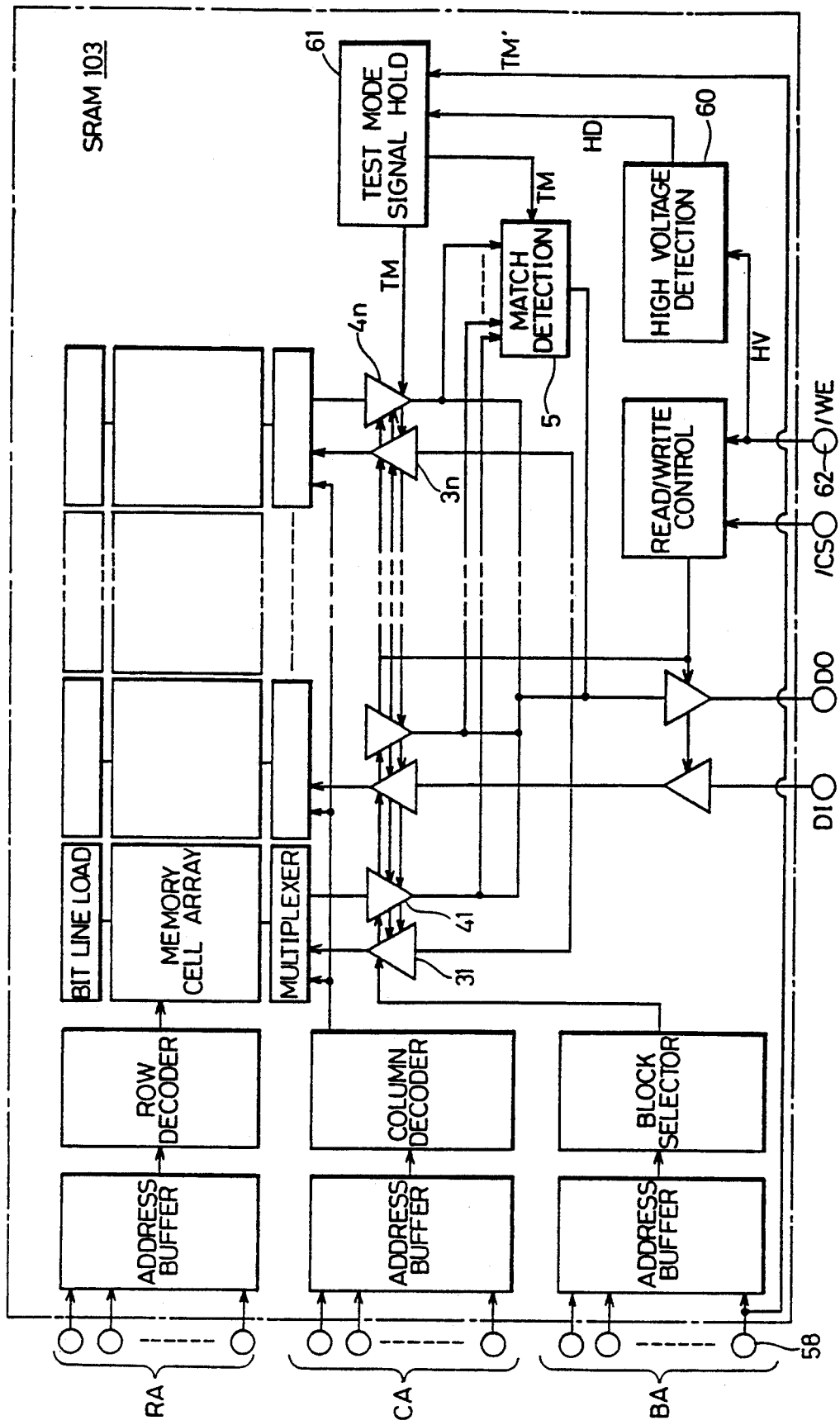
FIG. 12 is a block diagram showing still another example of the SRAM showing the background of the present invention.

In addition, high voltage detecting circuit 60' shown in FIG. 5 may be applied in place of high voltage detecting circuits 59 and 60 in the SRAM's 102 and 103 of FIGS. 11 and 12. The fusion of fuse 89 in high voltage detecting circuit 60' causes the high level holding signal HD and the high level test mode signal to be constantly provided. Therefore, the test mode operation is prevented from undesirably occurring also in this SRAM's 102 and 103.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a first terminal for receiving an externally applied pulse signal;
   a second terminal for receiving an externally applied test mode signal;
   pulse width detecting means for detecting that the pulse signal applied through said first terminal has a pulse width exceeding a predetermined time length;
   test mode signal holding means responsive to said pulse width detecting means for holding the test mode signal applied through said second terminal;
   test circuit means responsive to the test mode signal held in said test mode signal holding means for performing a test in said semiconductor memory device; and
   disabling means for disabling a detecting operation by said pulse width detecting means when the test should not be carried out by said test circuit means.

2. The semiconductor memory device according to claim 1, wherein said disabling means comprises disconnecting means for disconnecting said pulse width detecting means from said first terminal when the test should not be carried out by said test circuit means.

3. The semiconductor memory device according to claim 1, wherein said disconnecting circuit means comprises
   fuse means connected between said first terminal and said pulse width detecting means, and
   current path means for forming a current path for fusing said fuse means so that the test may not be carried out by said test circuit means.

4. The semiconductor memory device according to claim 2, wherein said pulse width detecting means comprises
   delay means for delaying the pulse signal applied through said disconnecting circuit means by said predetermined time length, and
   logical product circuit means for receiving a pulse signal applied through said disconnecting circuit means and a pulse signal delayed by said delay means.

5. The semiconductor memory device according to claim 1, wherein said test mode signal holding means comprises
   latch circuit means for latching the test mode signal applied through said second terminal, and
   means responsive to said pulse width detecting means for enabling said latch circuit means.

6. The semiconductor memory device according to claim 5, wherein said test mode signal holding means further comprises means responsive to the test mode signal applied through said second terminal for changing a signal latch state of said latch circuit means.

7. The semiconductor memory device according to claim 1, wherein said test mode signal holding means automatically generates and holds a non-test mode signal for preventing the test mode operation from occurring when the supply of a power supply voltage is started.

8. The semiconductor memory device according to claim 1, further comprising a plurality of memory cell arrays each provided with a plurality of memory cells arranged in rows and columns, and wherein
   said test circuit means comprises match detecting means, responsive to the test mode signal held in said test mode signal holding means, for detecting a match of the data signal read out from said plurality of memory cell arrays.

9. The semiconductor memory device according to claim 1, wherein at least one of said first and second terminals is shared to receive an externally applied control signal for controlling the operation in said memory device.

10. The semiconductor memory device according to claim 1, wherein said memory device is a static random access memory.

* * * * *